(12) United States Patent
Diegmann et al.

(10) Patent No.: US 10,436,827 B2
(45) Date of Patent: Oct. 8, 2019

(54) MEASUREMENT DEVICE AND METHOD FOR MEASURING THE IMPEDANCE OF A DEVICE UNDER TEST

(71) Applicant: Rohde & Schwarz GmbH & Co. KG, Munich (DE)

(72) Inventors: Philip Diegmann, Munich (DE); Jens Naumann, Chemnitz (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 192 days.

(21) Appl. No.: 15/352,429

(22) Filed: Nov. 15, 2016

(65) Prior Publication Data

US 2018/0136268 A1    May 17, 2018

(51) Int. Cl.
| | |
|---|---|
| *G01R 27/14* | (2006.01) |
| *G01R 1/20* | (2006.01) |
| *G01R 13/02* | (2006.01) |
| *G01R 27/08* | (2006.01) |
| *G01R 31/28* | (2006.01) |

(52) U.S. Cl.
CPC ............. *G01R 27/14* (2013.01); *G01R 1/203* (2013.01); *G01R 13/0218* (2013.01); *G01R 27/08* (2013.01); *G01R 31/2844* (2013.01)

(58) Field of Classification Search
CPC .......... H01M 10/6563; H01M 2/1077; H01M 10/625; H01M 10/6566; H01M 10/613; H01M 10/6557; H01M 2/1072; H01M 10/0525; H01M 2220/20; Y02P 70/54; Y02E 60/122

USPC ......................................... 324/609, 602, 600
See application file for complete search history.

(56) References Cited

U.S. PATENT DOCUMENTS

| | | | | |
|---|---|---|---|---|
| 2,534,565 A | * | 12/1950 | Warren ................ | G01R 13/208 324/121 R |
| 3,617,881 A | * | 11/1971 | McCormick ....... | G01R 19/0023 324/123 R |
| 7,027,940 B2 | * | 4/2006 | Iannuzzi ................ | G01R 27/28 324/312 |
| 7,088,263 B1 | * | 8/2006 | Krause ................ | G08G 5/0026 244/114 R |
| 2006/0241887 A1 | * | 10/2006 | Sakayori ............. | G01R 35/005 702/117 |
| 2007/0013407 A1 | * | 1/2007 | Okawa ................... | G01R 27/28 324/762.09 |
| 2015/0212145 A1 | * | 7/2015 | Liu ..................... | G01R 31/2646 324/613 |

(Continued)

*Primary Examiner* — Giovanni Astacio-Oquendo
(74) *Attorney, Agent, or Firm* — Schwabe, Williamson & Wyatt, P.C.

(57) ABSTRACT

A measurement device for measuring the impedance of a device under test is described. Said measurement device comprises at least one signal generator for generating a signal with a certain frequency wherein said signal is used for testing said device under test. Said measurement device further has at least one shunt resistor that is used for determining the electric current of said signal. Said device also comprise at least two voltage channels for measuring the voltage across said device under test. Said measurement device is an oscilloscope having at least four voltage inputs and wherein said measurement device is configured to derive the impedance of said device from said electric current and said voltage. Further, a method for measuring the impedance of a device under test is described.

19 Claims, 1 Drawing Sheet

(56) References Cited

U.S. PATENT DOCUMENTS

2015/0212185 A1* 7/2015 Pickerd ................. G01R 35/00
                                                    324/750.02
2015/0309109 A1* 10/2015 Tokuno .............. G01R 31/2601
                                                     324/658

* cited by examiner

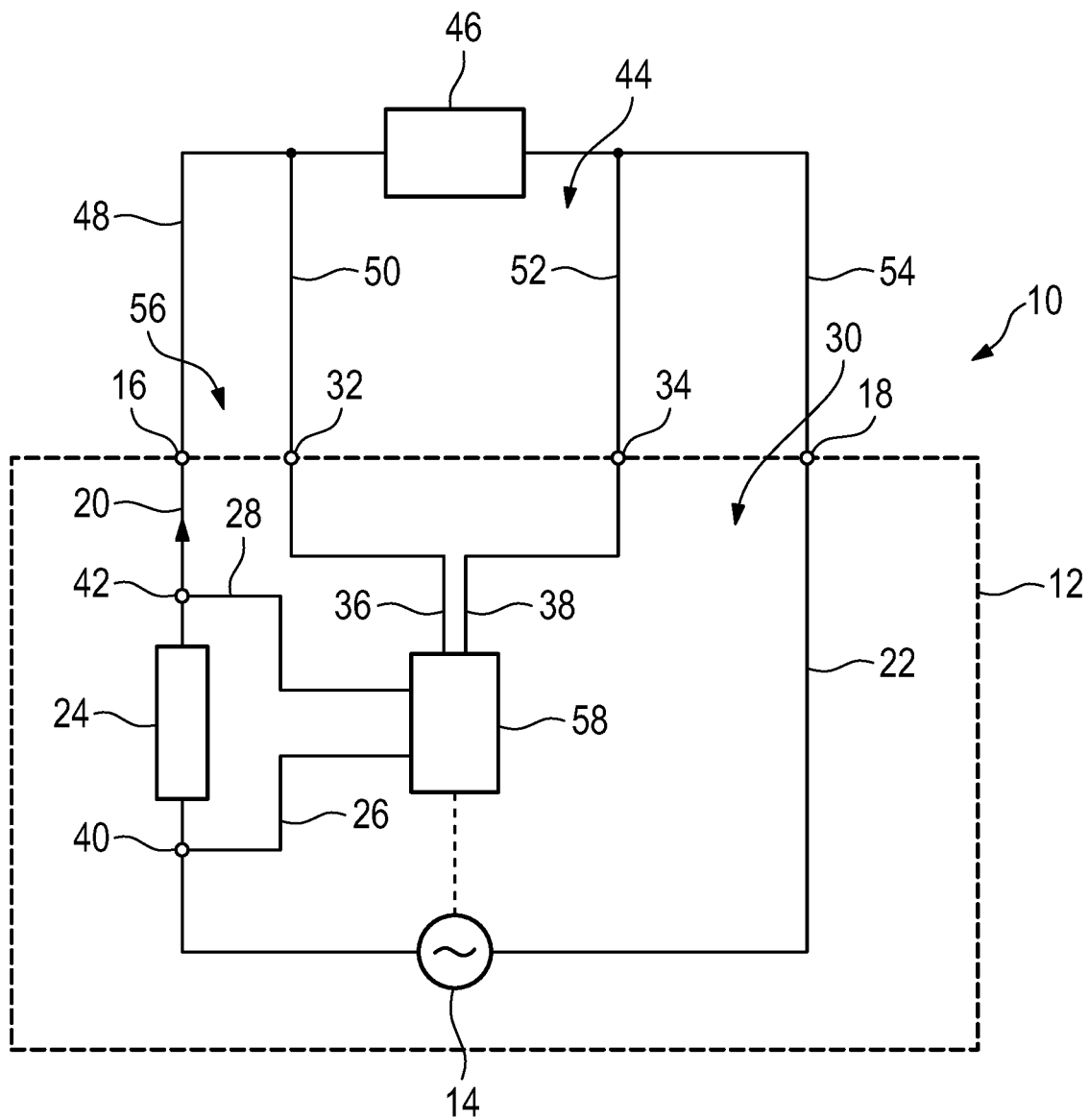

MEASUREMENT DEVICE AND METHOD FOR MEASURING THE IMPEDANCE OF A DEVICE UNDER TEST

TECHNICAL FIELD

The invention relates to a measurement device for measuring the impedance of a device under test and a method for measuring the impedance of a device under test.

BACKGROUND OF THE INVENTION

In the prior art, it is known to use LCR meters for measuring the impedance of an external device under test. LCR meters are configured to measure the inductance (L), the capacitance (C) as well as the resistance (R) of the device under test, for instance an electronic component. The impedance of the device under test can be derived from the measured capacitance and/or the measured inductance. Further, different LCR meters are also known that directly measure the impedance of the device under test.

Furthermore, time-domain measurement devices are known which are used for analyzing certain signals which might be generated by a device under test with regard to the time of the signal. For instance, a time-domain measurement device is used for pulse width, repetition rate, signal timing, etc. An oscilloscope is a typical time-domain measurement device.

Accordingly, many different measurement devices are known which have certain specific functions. However, a user always has to purchase and carry all of these different measurement devices in order to test the different properties of a device under test such as inductance (L), capacitance (C), resistance (R), time-domain measurements and/or frequency-domain measurements.

SUMMARY OF THE INVENTION

The invention provides a measurement device for measuring the impedance of a device under test, comprising:
  at least one signal generator for generating a signal with a certain frequency wherein said signal is used for testing said device under test,
  at least one shunt resistor that is used for determining the electric current of said signal, and
  at least two voltage channels for measuring the voltage across said device under test,
  wherein said measurement device is an oscilloscope having at least four voltage inputs and wherein said measurement device is configured to derive the impedance of said device from said electric current and said voltage.

The invention further provides a method for measuring the impedance of a device under test, with the following steps:
  Providing a measurement device for measuring the impedance of said device under test wherein said measurement device is an oscilloscope having at least four voltage inputs,
  Connecting said device under test with said measurement device,
  Applying a voltage on said device under test, said voltage being generated by said measurement device,
  Measuring the current flowing through said device under test via said measurement device, and
  Measuring the voltage across said device under test via said measurement device.

The invention is based on the finding that the impedance, in particular the complex impedance, of the device under test can also be measured by a single measurement device which is an oscilloscope having four voltage inputs. Thus, there is no more need for a separate LCR meter in order to determine the impedance of the device under test. The signal generated by the internal signal generator is a voltage which is applied to the device under test wherein that signal is used for testing purposes. The signal is generated and forwarded to the device under test. Accordingly, the voltage across the device under test as well as the current flowing through the device under test are measured by one and the same device which in addition is configured to perform time-domain measurements like an oscilloscope. Thus, the measurement device according to the invention is able to determine the impedance on its own. In general, the measurement device has additional functions with respect to a usual LCR meter as well as an additional function with respect to an oscilloscope which is typically used for time-domain measurements.

According to an aspect, the current flowing through said shunt resistor corresponds to the current flowing through said device under test. Thus, the line comprising the shunt resistor is coupled with the device under test in series in order to ensure that the current flowing through the shunt resistor is the same one that flows through the device under test.

Particularly, said signal generator is configured to generate signals at different frequencies. The signal generator is configured to generate alternate voltage at different frequencies, for instance. As the generated signal, in particular the generated voltage and current, is used for determining the impedance of the device under test, the impedance can be measured for different frequencies. Since the impedance depends on the frequency of the generated signal, all information required with regard to the impedance can be gathered, in particular the change of impedance with respect to the frequency.

According to another aspect, said measurement device comprises two second voltage channels that are connected to said shunt resistor. These second voltage channels are used to determine the current flowing through the device under test such that the impedance can be calculated by using that current determined at least indirectly. The second voltage channels may be integrated in the measurement device. Thus, the current flowing through the shunt resistor and, therefore, the current through the device under test is internally measured without any external device.

Particularly, a voltage across the shunt resistor is measured via said two second voltage channels. The voltage across the shunt resistor can be measured as both second voltage channels are connected to the line comprising the shunt resistor, in particular before and after the shunt resistor, respectively.

Further, said electric current may be derived from the voltage measured across the shunt resistor and the resistance value of said shunt resistor. Since the resistance value of the shunt resistor is known, the measured voltage as well as the resistance value can be used to determine the current flowing through the shunt resistor according to the Ohm's law.

Accordingly, the four voltage inputs of the measurement device being an oscilloscope are used for determining the voltage across the device under test as well as the voltage across the shunt resistor in order to determine the current flowing through the shunt resistor. Hence, at least two of the four voltage inputs of the oscilloscope are diverted from their usual intended use which means that they are used in a different way as originally intended.

According to another aspect, said signal generator and said two voltage channels provide a four terminal sensing unit. The signal generator generates the signal which is applied to the device under test wherein the voltage across the device under test is measured via the voltage channels being separated to the lines carrying the signal, in particular the current, used for measuring the device under test. Thus, it is ensured that an accurate measurement of the device under test is obtained.

According to an embodiment, at least said voltage channels provide an interface for said device under test such that said device under test can be connected with said interface of said measurement device for testing purposes. The device under test is connected to said voltage channels integrated in the measurement device. For instance, the voltage channels are connected to certain ports which can be easily coupled to the device under test such as inputs of a measurement unit.

Moreover, the voltage channels and the lines carrying the signal generated by the signal generator may establish a common interface such that the device under test has only to be connected with two interface ports instead of four even though a four terminal sensing is provided.

Said shunt resistor may be located downstream of said signal generator. Thus, the shunt resistor and the signal generator are connected with each other in series. More precisely, both are connected with each other via that line being used for applying the current to the device under test.

Particularly, said shunt resistor is integrated in said measurement device. Hence, the current flowing through the shunt resistor which corresponds to the current flowing through the device under test is measured internally in the measurement device. Hence, there is no need for any external measurement equipment for determining the current flowing through the device under test.

According to another aspect, said measurement device comprises at least one processing unit that is configured to determine the impedance of said device under test. The processing unit processes the data/information received in order to determine the impedance of the device under test. Thus, the processing unit does the calculations which are needed.

Particularly, said processing unit derives the impedance of said device under test from said voltage measured across said device under test and the electric current flowing through said shunt resistor. Accordingly, the processing unit is connected with the second voltage channels as well as with the voltage channels in order to receive the data, in particular the current and the voltage across the device under test.

Particularly, said inputs correspond to said voltage channels. Hence, the inputs of the oscilloscope are used for determining the impedance of the device under test.

Further, said signal generator may have at least two outputs being connected to two of said four voltage inputs. The outputs of the signal generator and the two voltage inputs of the oscilloscope are coupled with each other such that the impedance of the device under test can be determined, in particular measured, without any additional measurement equipment aside from connecting lines being used for connecting the device under test with the outputs and inputs which might be formed by ports, in particular coaxial ports.

According to an aspect, said voltage is applied via a signal generated by an internal signal generator of said measurement device. The signal generator generates a signal, for instance a sine wave signal, such that a voltage is applied to the device under test.

According to another aspect, said signal generator has a frequency range, the frequency of said signal generated being selected. Thus, the device under test can be examined for different frequencies in order to determine the impedance for different frequencies. The frequency can be selected manually. Alternatively or in addition, the frequency is automatically shifted during the measurement procedure in order to guarantee that at least certain, in particular predetermined, frequencies are used during the measurement.

Further, the voltage measurement and the current measurement may be performed simultaneously. Thus, the impedance can be determined very fast.

Particularly, said measurement device is a measurement device as described above.

BRIEF DESCRIPTION OF DRAWINGS

The invention will now be described with reference to a preferred embodiment which is schematically shown in FIG. 1.

DETAILED DESCRIPTION

In FIG. 1, a measurement device 10 is shown which comprises a housing 12 which encompasses inter alia a signal generator 14 being configured to generate a certain signal, for instance a sine wave signal. Particularly, the signal generator 14 is configured to generate a signal having different frequencies.

The signal generator 14 is connected with two outputs 16, 18 of the measurement device 10 via lines 20, 22 wherein the outputs 16, 18 are formed by ports, for instance coaxial ports. The lines 20, 22 are used for conducting the signal generated by the signal generator 14. The signal generated by the signal generator 14 corresponds to a voltage being provided at the outputs 16, 18 of the measurement device 10.

Further, the measurement device 10 comprises a shunt resistor 24 which is located in the line 20 such that the shunt resistor 24 is positioned downstream of the signal generator 14. Thus, the signal generated flows through the shunt resistor 24.

In order to determine the electric current flowing through the shunt resistor 24, two second voltage channels 26, 28 are provided which are connected to the line 20 before of the shunt resistor 24 and after the shunt resistor 24. Thus, the voltage across the shunt resistor 24 can be measured via the second voltage channels 26, 28. However, as the resistance value of the shunt resistor 24 is known, the current flowing through the shunt resistor 24 can be determined according to Ohm's law (U=R*I) since the voltage and the resistance are known. The electric current flowing through the shunt resistor 24 depends on the signal generated by the signal generator 14.

In general, the electric current of the signal generated can be gathered internally due to the internally integrated shunt resistor 24 as will be described later.

Further, the measurement device 10 has a measurement unit 30 being configured to perform time-domain measurements such that the whole measurement device 10 is also configured to perform these measurements. Thus, the measurement unit 30 is an oscilloscope unit. Accordingly, the whole measurement device 10 can be deemed as an oscilloscope.

The measurement unit 30 has two voltage inputs 32, 34 which are also formed by ports, in particular coaxial ports. In general, the voltage inputs 32, 34 correspond to two voltage channels 36, 38 used for measuring purposes. Thus, these voltage inputs 32, 34 are also inputs of the measurement device 10.

Besides these voltage inputs 32, 34, the measurement unit 30 has two second voltage inputs 40, 42 which correspond to the second voltage channels 26, 28. Accordingly, the later two second voltage inputs 40, 42 are used for determining the electrical current flowing through the shunt resistor 24 as already described.

The voltage inputs 32, 34 of the measurement unit 30 being inputs of the measurement device 10 as well as the outputs 16, 18 of the signal generator 14 establish an interface 44 of the whole measurement device 10 which is used for a device under test 46 as shown in the FIGURE.

Accordingly, two of the voltage inputs 32, 34 of the measurement unit 30 and the outputs 16, 18 are coupled to the device under test 46. Thus, the interface 44 is provided by the voltage inputs 32, 34 corresponding to the voltage channels 36, 38 as well as the outputs 16, 18 corresponding to the signal generator 14.

As can be seen, four connecting lines 48, 50, 52, 54 are used to connect the device under test 46 with the outputs 16, 18 and the voltage inputs 32, 34, in particular the interface 44 of the measurement device 10.

Accordingly, the measurement device 10 is used to measure or rather determine the impedance of the device under test 46 being connected to the measurement device 10 via the interface 44.

Instead of the shown embodiment, the voltage inputs 32, 34 and the outputs 16, 18 also can form a common interface such that the device under test 46 has only to be connected via two connecting lines instead of four.

As already mentioned, the measurement unit 30 representing the oscilloscope function has four voltage inputs 32, 34, 40, 42. Two of these voltage inputs, namely the second voltage inputs 40, 42, correspond to the second voltage channels 26, 28 used for determining the electric current flowing through the shunt resistor 24 whereas the other two voltage inputs 32, 34 are used for determining the voltage across the device under test 46. Accordingly, the measurement device 10 being an oscilloscope has four voltage channels 26, 28, 36, 38 corresponding to these four voltage inputs 32, 34, 40, 42.

In general, the measurement procedure is done as described hereinafter.

The signal generator 14 of the measurement device 10 generates a signal which runs through the lines 20, 22 such that a certain voltage is applied to the device under test 46 being connected to the measurement device 10 for testing purposes, in particular to the outputs 16, 18 being directly connected with the signal generator 14 via the lines 20, 22.

Accordingly, the current generated flows through the line 20, the shunt resistor 24 located in the line 20, the first output 16, the device under test 46, the second output 18, the line 22 back to the signal generator 14. As already mentioned, a voltage is applied to the device under test 46 being generated by the signal generator 14 which is the reason why these ports are called outputs 16, 18 since the signal generated is outputted externally.

Since the device under test 46 and the signal generator 14 are connected in series with each other, the same current flows through the shunt resistor 24 and the device under test 46. Therefore, the current flowing through the device under test 46 can be measured easily and internally via the integral shunt resistor 24 being integrated into the measurement device 10.

Thus, the second voltage channels 26, 28 corresponding to the second voltage inputs 40, 42 are used for measuring the voltage across the shunt resistor 24 wherein the current flowing through the shunt resistor 24 can be derived by the measured voltage according to Ohm's law since the resistance value of the shunt resistor 24 is known. Hence, two of the voltage inputs 32, 34, 40, 42 of the oscilloscope are used for determining the current flowing through the device under test 46.

Further, the voltage across the device under test 46 is measured via the voltage channels 36, 38 corresponding to the voltage inputs 32, 34 of the measurement unit 30. In fact, the voltage channels 36, 38 are lines which do not carry any current as they are separated to the current-carrying lines 20, 22 used for applying the signal generated which is needed for measurement purposes.

Such a measurement arrangement is also called a four terminal measurement. Since the voltage channels 36, 38 are only provided for measuring the voltage of the device under test 46, a very accurate measurement can be obtained. Accordingly, the measurement device 10 has a four terminal sensing unit 56 established by the outputs 16, 18 of the signal generator 14 as well as the voltage inputs 32, 34 of the measurement unit 30 which are connected with each other via the device under test 46, in particular its connecting ports.

Thus, the current flowing through as well as the voltage across the device under test 46 can be measured simultaneously by the single measurement device 10.

Furthermore, the measurement device 10, in particular its measurement unit 30, has a processing unit 58 which is connected to the second voltage channels 26, 28 and the voltage channels 36, 38 ensuring that the information gathered can be processed appropriately, in particular the measured electric current and the voltage. Generally, the processing unit 58 is part of the measurement unit 30 providing the oscilloscope function of the measurement device 10.

The processing unit 58 processes these data gathered such that the impedance of the device under test 46 is determined without any further measurement equipment.

Accordingly, the measurement unit 30 comprises a processing unit 58 besides the four voltage inputs 32, 34, 40, 42. Furthermore, each of the voltage channels 26, 28, 36, 38 corresponding to the voltage inputs 32, 34, 40, 42 may comprise an analog-digital-converter, a trigger unit and a data storage, in particular an acquisition storage.

As the signal generator 14 is configured to generate signals at different frequencies, in particular apply alternating voltages with different frequencies to the device under test 46, the impedance of the device under test 46 can be measured for different frequencies. This is an important issue as the impedance depends on the frequency.

Hence, the frequency behavior of the device under test 46 can also be investigated by said measurement device 10.

The frequencies of the signal generated can be selected manually by the user. Alternatively or in addition, the measurement unit 30, in particular its processing unit 58, is also connected with the signal generator 14 in order to control the signal generator 14, in particular the frequency of the signal generated. Thus, certain frequency shifts can be automatically performed by the measurement device 10 such that the user has not to be aware of finding the best test settings. The testing will be automatically performed for certain different frequencies.

Since the measurement unit 30 is at least an oscilloscope unit, at least the voltage inputs 32, 34 of the measurement unit 30 can still be used for time-domain measurements. The integrated signal generator 14 is additionally used for generating a signal being used for determining the impedance of the device under test 46 to be connected to the measurement device 10.

The second voltage inputs 40, 42 may be integrally connected to the line 20 or via connecting lines which can be removed if not needed such that the four voltage inputs 32, 34, 40, 42 of the oscilloscope can be used for different measurement purposes.

Accordingly, the impedance of a certain device under test 46 can be measured easily since no additional measurement equipment is necessary.

The invention claimed is:

1. A measurement device for measuring the impedance of a device under test, comprising:
    at least one signal generator for generating a signal with a certain frequency wherein said signal is used for testing said device under test;
    at least one shunt resistor that is used for determining the electric current of said signal flowing through said device under test; and
    at least two voltage channels for measuring the voltage across said device under test, wherein said measurement device is an oscilloscope having at least four voltage inputs, and wherein said measurement device is configured to derive the impedance of said device under test from said electric current and said voltage.

2. The device according to claim 1, wherein said shunt resistor is coupled in series between said at least one signal generator and said device under test and the current flowing through said shunt resistor corresponds to the current flowing through said device under test.

3. The device according to claim 1, wherein said at least one signal generator is configured to generate signals at different frequencies.

4. The device according to claim 1, wherein said measurement device comprises two second voltage channels that are connected to said shunt resistor.

5. The device according to claim 4, wherein a voltage across the shunt resistor is measured via said two second voltage channels.

6. The device according to claim 5, wherein said electric current is derived from the voltage measured across the shunt resistor and the resistance value of said shunt resistor.

7. The device according to claim 1, wherein said at least one signal generator and said two voltage channels provide a four terminal sensing unit.

8. The device according to claim 1, wherein at least said voltage channels provide an interface for said device under test such that said device under test can be connected with said interface of said measurement device for testing purposes.

9. The device according to claim 1, wherein said shunt resistor is located downstream of said signal generator.

10. The device according to claim 1, wherein said shunt resistor is integrated in said measurement device.

11. The device according to claim 1, wherein said measurement device comprises at least one processing unit that is configured to determine the impedance of said device under test.

12. The device according to claim 11, wherein said processing unit derives the impedance of said device under test from said voltage measured across said device under test and the electric current flowing through said shunt resistor.

13. The device according to claim 1, wherein said inputs correspond to said voltage channels.

14. The device according to claim 1, wherein said signal generator has at least two outputs being connected to two of said four voltage inputs.

15. A method for measuring the impedance of a device under test, comprising:
    providing a measurement device for measuring the impedance of said device under test wherein said measurement device is an oscilloscope having at least four voltage inputs;
    connecting said device under test with said measurement device;
    applying a voltage on said device under test, said voltage being generated by said measurement device;
    measuring the current flowing through said device under test via said measurement device; and
    measuring the voltage across said device under test via said measurement device,
    wherein said measurement device includes:
    a signal generator generating a signal with a variable frequency, wherein said signal supplies the voltage to said device under test; and
    a shunt resistor connected in series between said signal generator and said device under test, wherein
    a first pair of said four voltage inputs measure a voltage across said shunt resistor and a current flowing through said shunt resistor is derived from the voltage measured across said shunt resistor;
    a second separate pair of said four voltage inputs measure the voltage across said device under test; and
    said current flowing through said shunt resistor and said voltage across said device under test are used to derive said impedance of said device under test.

16. The method according to claim 15, wherein said voltage is applied via a signal generated by an internal signal generator of said measurement device.

17. The method according to claim 16, wherein said signal generator has a frequency range, the frequency of said signal generated being selected.

18. The method according to claim 15, wherein the voltage measurement and the current measurement are performed simultaneously.

19. A measurement device for measuring the impedance of a device under test, comprising:
    a signal generator generating a signal with a variable frequency wherein said signal is used for testing said device under test;
    a shunt resistor coupled in series between said signal generator and said device under test; and
    a first pair of voltage channels measuring said voltage across said shunt resistor, wherein said voltage across said shunt resistor is used to derive a current flowing through said shunt resistor; and
    a second pair of voltage channels separate from the first pair of voltage channels separately measuring said voltage across said device under test,
    wherein said current flowing through said shunt resistor and said voltage across said device under test are used to derive said impedance of said device under test.

* * * * *